(12) United States Patent
Chien

(10) Patent No.: US 8,324,648 B2
(45) Date of Patent: Dec. 4, 2012

(54) SEMICONDUCTOR LIGHT EMITTING DEVICE PACKAGE

(75) Inventor: Ko-Wei Chien, Hsinchu (TW)

(73) Assignee: Advanced Optoelectric Technology, Inc., Hsinchu Hsien (TW)

( * ) Notice: Subject to any disclaimer, the term of this patent is extended or adjusted under 35 U.S.C. 154(b) by 147 days.

(21) Appl. No.: 12/939,180

(22) Filed: Nov. 4, 2010

(65) Prior Publication Data

US 2011/0186891 A1    Aug. 4, 2011

(30) Foreign Application Priority Data

Jan. 29, 2010 (TW) .............................. 99102580 A

(51) Int. Cl.
*H01L 33/60* (2010.01)
(52) U.S. Cl. ................ 257/98; 257/99; 257/E33.067; 257/E33.072; 257/E33.074
(58) Field of Classification Search .................. None
See application file for complete search history.

(56) References Cited

U.S. PATENT DOCUMENTS

| | | | | |
|---|---|---|---|---|
| 6,642,547 B2 * | 11/2003 | Matsubara et al. | ............. | 257/98 |
| 6,674,096 B2 * | 1/2004 | Sommers | ......................... | 257/98 |
| 7,294,912 B2 * | 11/2007 | Takeuchi et al. | ............... | 257/675 |
| 2006/0097366 A1 * | 5/2006 | Sirinorakul et al. | ........... | 257/666 |
| 2006/0170335 A1 * | 8/2006 | Cho et al. | ........................ | 313/501 |
| 2006/0285804 A1 * | 12/2006 | Kinoshita | ......................... | 385/92 |
| 2009/0244903 A1 * | 10/2009 | Wong et al. | .................... | 362/308 |
| 2009/0267104 A1 * | 10/2009 | Hsu et al. | ......................... | 257/99 |
| 2011/0186888 A1 * | 8/2011 | Chien | ............................. | 257/98 |

* cited by examiner

*Primary Examiner* — Calvin Lee
*Assistant Examiner* — Abul Kalam
(74) *Attorney, Agent, or Firm* — Altis Law Group, Inc.

(57) ABSTRACT

A plurality of reflective nanometer-structures formed on the reflective surface of a semiconductor light emitting device package increases light emitting efficiency. Every pitch between each reflective nanometer-structure has an interval P shorter than the half wavelength of the visible light. Moreover, each of the plurality of reflective nanometer-structures has a depth H, wherein the ratio of the depth H over the interval P is not less than 2.

18 Claims, 17 Drawing Sheets

SEMICONDUCTOR LIGHT EMITTING DEVICE PACKAGE

BACKGROUND

1. Technical Field

The disclosure relates generally to semiconductor technology, and more particularly to a semiconductor light emitting device package.

2. Description of the Related Art

With progress in semiconductor light emitting device development, light emitting diodes (LEDs), organic light emitting diodes (OLEDs), and laser diodes (LDs) are becoming increasingly popular, due to longer lifetime, lower power consumption, less heat generation, and compact size. Semiconductor light emitting device packages provide a reflector to accommodate the light field of the semiconductor light emitting devices. Generally, the reflector is polyphthalamide (PPA) or polypropylene (PP), having limited reflection due to luminous absorption that results in light extraction reduction. What is needed, therefore, is a semiconductor light emitting device package which can overcome the described limitations.

DETAILED DESCRIPTION

Exemplary embodiments of the disclosure will now be described with reference to the accompanying drawings.

Figure 1:
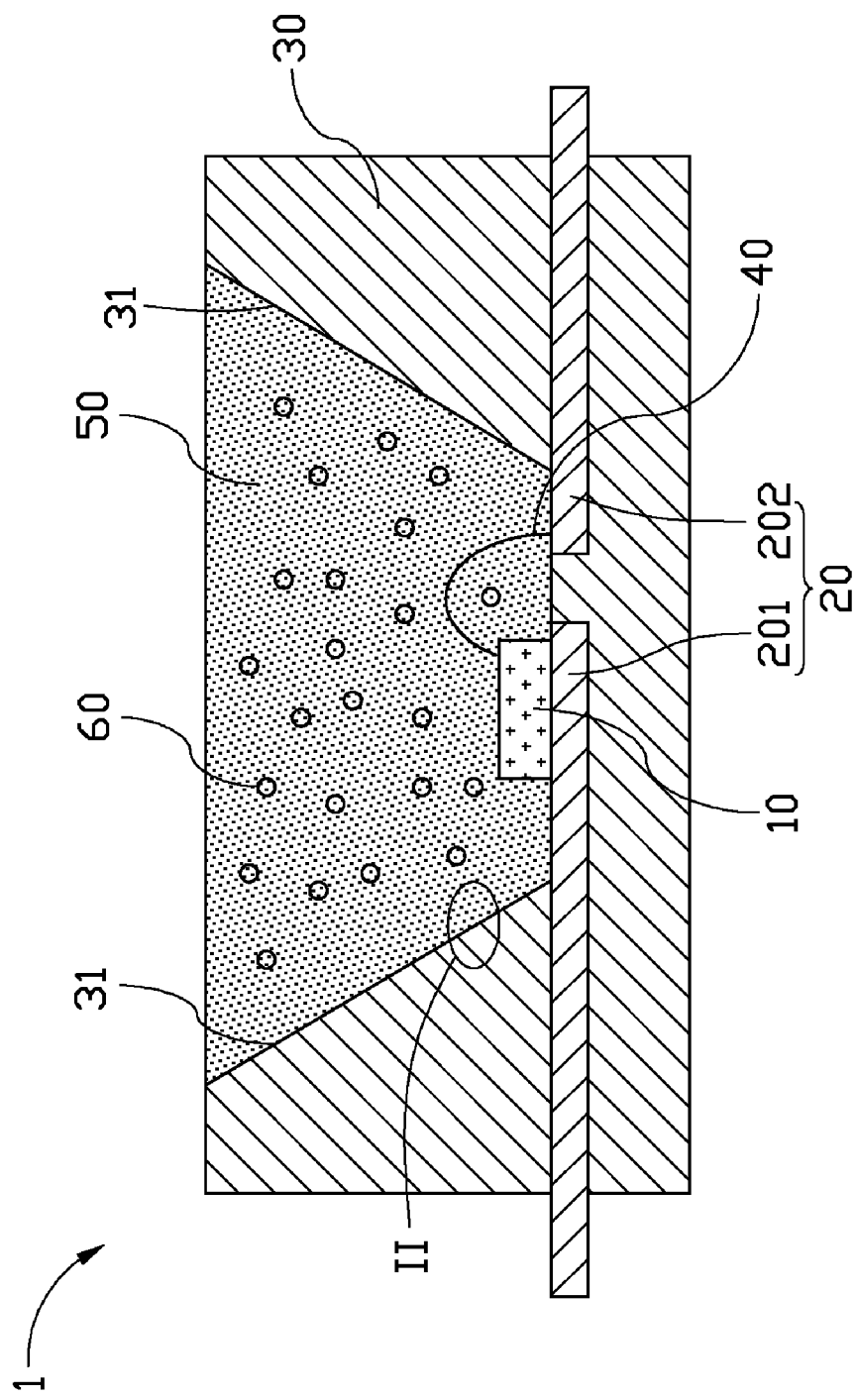
FIG. 1 is a cross section of a semiconductor light emitting device package in accordance with a first embodiment of the disclosure.

As shown in FIG. 1, the disclosure provides a first embodiment of a semiconductor light emitting device package 1, comprising a semiconductor light emitting device 10, a lead frame 20 and a reflector 30.

The lead frame 20 comprises a carrier 201 and a connection 202, electrically disconnected from each other. The semiconductor light emitting device 10 is disposed on the carrier 201 and is electrically connected to the connection 202 by conductive wire 40. In the disclosure, a portion of the lead frame 20 is encapsulated by the reflector 30.

The semiconductor light emitting device 10 is capable of emitting light of at least one wavelength. Specifically, the semiconductor light emitting device 10 is a III-V or II-VI compound semiconductor able to emit visible or invisible light such as that of ultraviolet, blue, green or multiple wavelengths. Alternatively, the semiconductor light emitting device 10 can be a light emitting diode (LED), organic light emitting diodes (OLED), or laser diode (LD). Moreover, the semiconductor light emitting device 10 can comprise multiple devices able to emit different light of varied wavelengths respectively.

The semiconductor light emitting device package 1 also provides a cover layer 50 encapsulating the semiconductor light emitting device 10 and a portion of the lead frame 20. In the disclosure, the cover layer 50 is silicon oxide, epoxy or any transparent material. Alternatively, the cover layer 50 can comprise diffusers for enhancing light extraction from the cover layer 50.

To obtain white or mixed light emitted from the semiconductor light emitting device package 1, at least one wavelength converting element 60 is doped into the cover layer 50. When the wavelength converting element 60 is excited by light emitted from the semiconductor light emitting device 10, thereafter, converted light is emitted from the wavelength converting element 60 to mix with other light from the semiconductor light emitting device 10 to generate white or mixed light. In the disclosure, the wavelength converting element 60 is YAG, TAG, silicate, nitride, nitrogen oxides, phosphide, sulfide or combination thereof.

Figure 2:
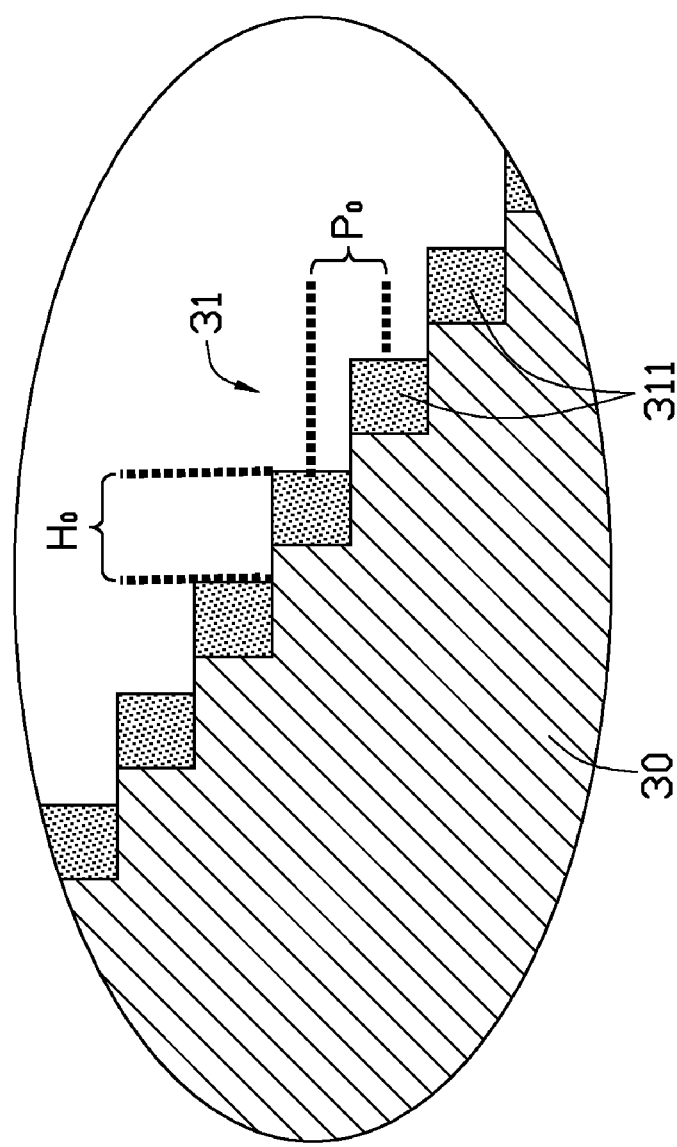
FIG. 2 is an enlarged view of a circled portion II of FIG. 1, showing a cross section of a plurality of first reflective nanometer-structures of the semiconductor light emitting device package of FIG. 1.
Figure 3:
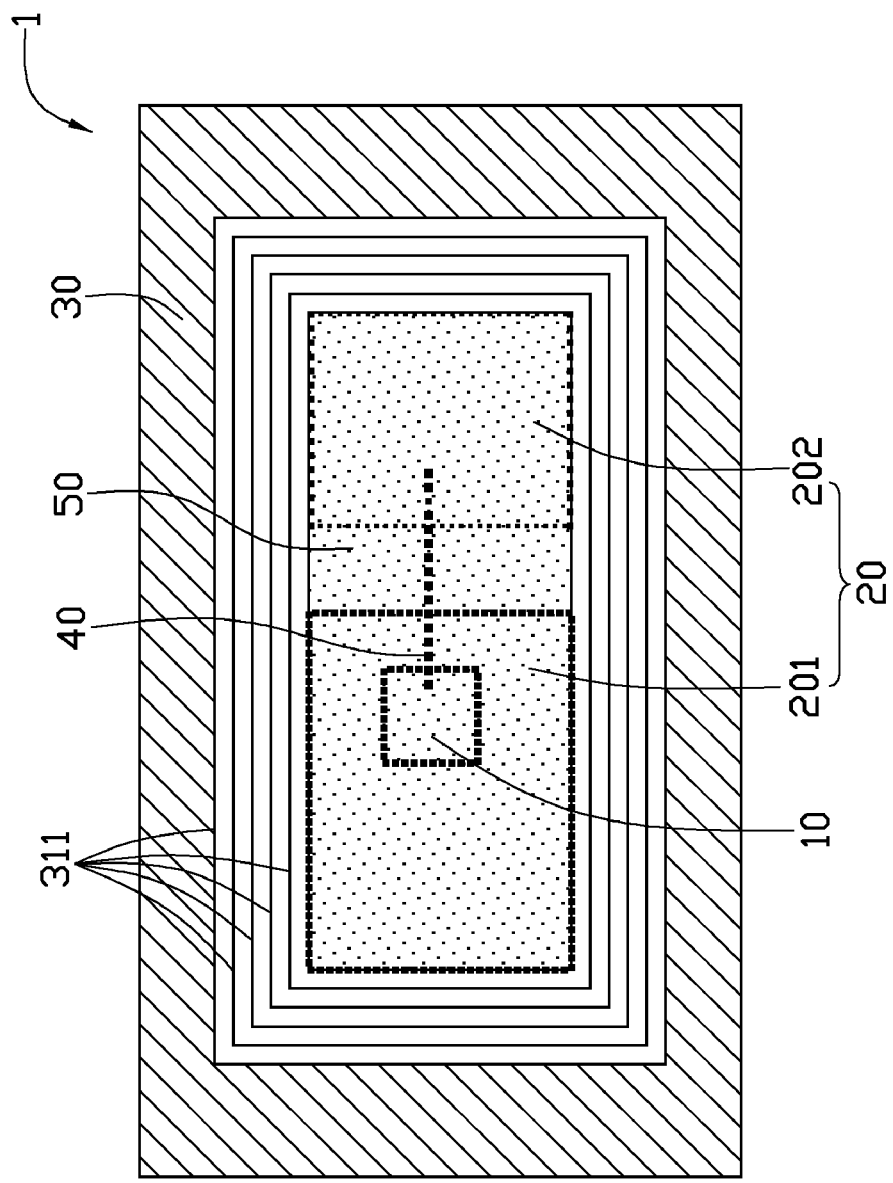
FIG. 3 is a top view of the semiconductor light emitting device package in accordance with the first embodiment of FIG. 1.
Figure 4A:
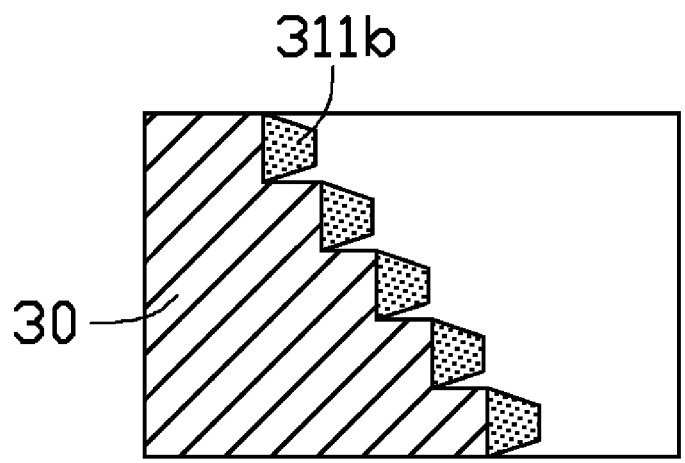
FIGS. 4A to 4F are cross sections of a plurality of first nanometer-reflective structures with modified structures.
Figure 4B:
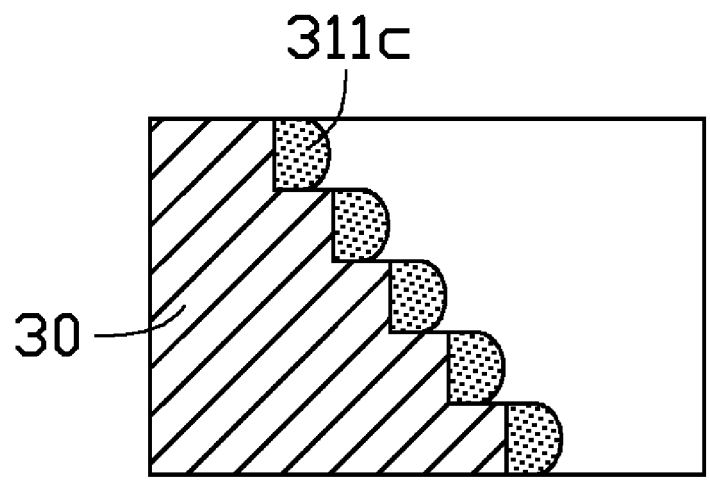
Figure 4C:
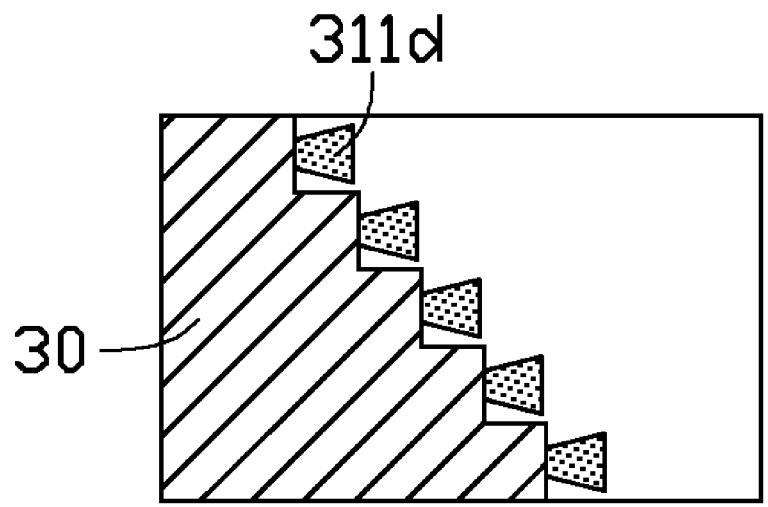
Figure 4D:
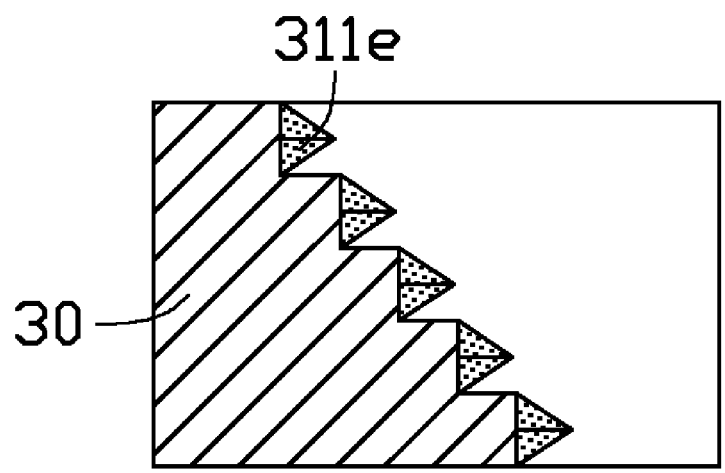
Figure 4E:
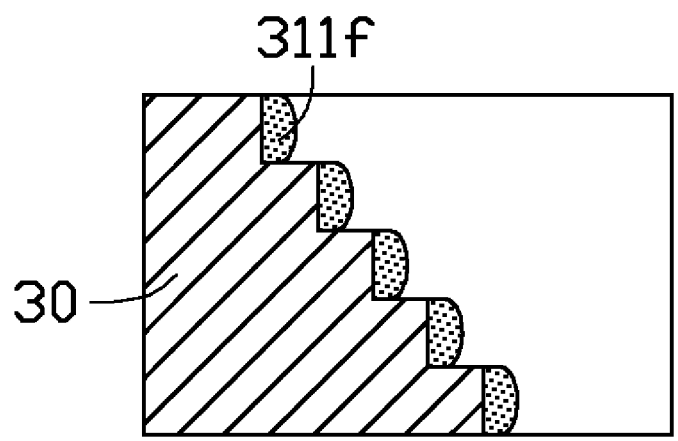
Figure 4F:
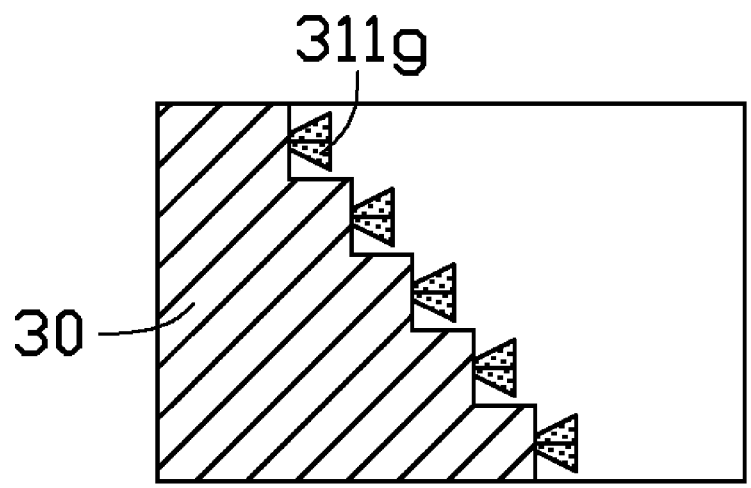

The reflector 30 is allocated on the lead frame 20, comprising a first reflective surface 31 surrounding the semiconductor light emitting device 10. In the disclosure, the reflector 30 is plastic, ceramic, silicon or metal. Referring to FIG. 2, the first reflective surface 31 has a plurality of first reflective nanometer-structures 311 arranged separately, wherein every pitch between each first reflective nanometer-structure 311 has a first interval $P_0$ shorter than half the wavelength of the visible light. Specifically, the first interval $P_0$ is about 90 to 130 nm. Moreover, each of the plurality of first reflective nanometer-structures 311 has a first depth $H_0$, wherein the ratio of the first depth $H_0$ over the first interval $P_0$ is not less than 2. Accordingly, the disclosure provides emitted light reorganized from reaction of the first reflective nanometer-structures 311 and the emitted light, whereby reflective efficiency of the reflector 30 is enhanced. In the disclosure, the plurality of first reflective nanometer-structures 311 is aluminum or titanium formed by E-beam or etching. Additionally, refractive index of the plurality of first reflective nanometer-structures 311 exceeds the refractive index of the reflector 30, whereby reflective efficiency of the reflector 30 is enhanced. Referring to FIG. 3, the top view of the first reflective nanometer-structures 311 are multiple rectangles surrounding the semiconductor light emitting device 10. However, the top view of the first reflective nanometer-structures 311 is not limited thereto and can have any structure sufficient to the same purpose. Referring to FIG. 2, the cross section of each first reflective nanometer-structure 311 is rectangular. Alternatively, they also can be trapezoid, semicircular, inverse-trapezoid, pyramided, elliptic, inverse-pyramided or irregular, as shown in FIGS. 4A-4F.

Figure 5:
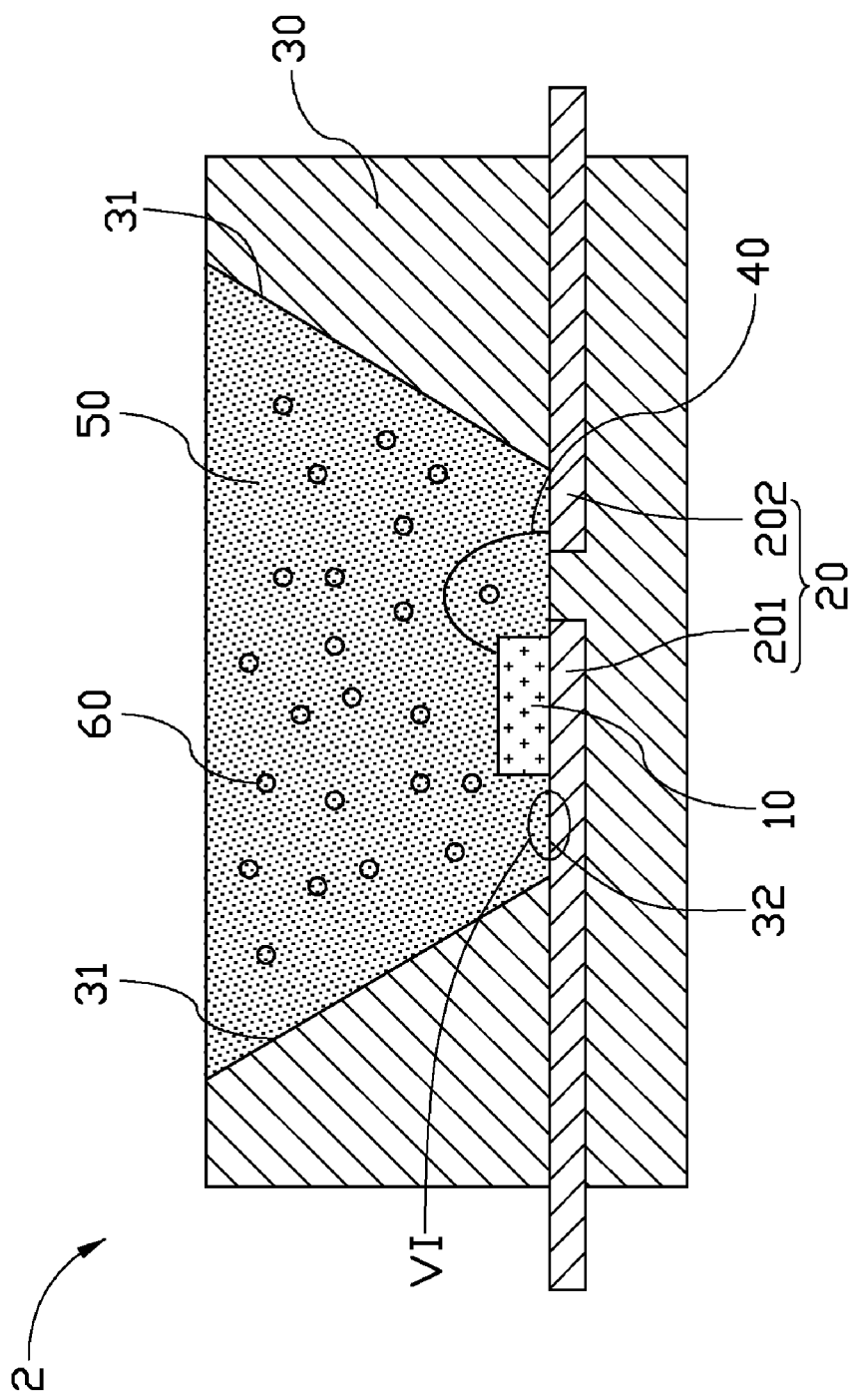
FIG. 5 is a cross section of a semiconductor light emitting device package in accordance with a second embodiment of the disclosure.
Figure 6:
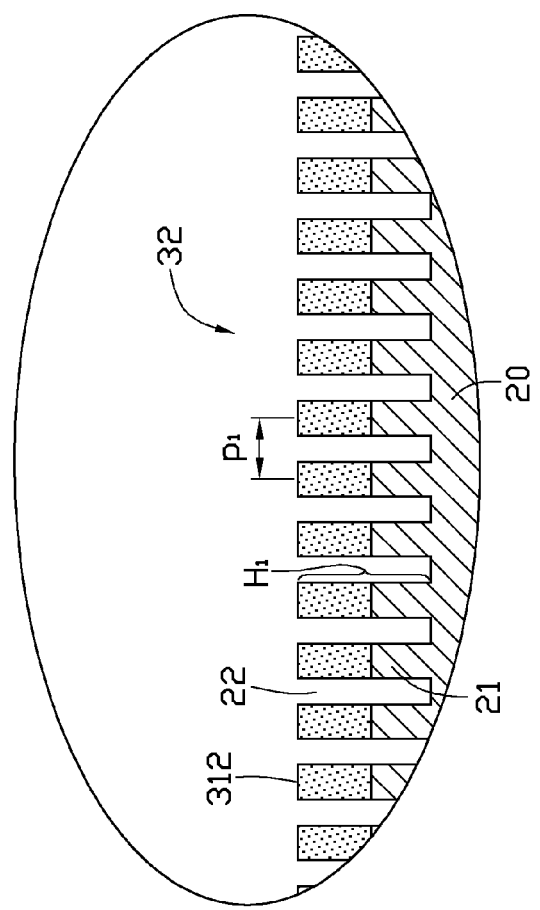
FIG. 6 is an enlarged view of a circled portion VI of FIG. 5, showing a cross section of a plurality of second reflective nanometer-structures of the semiconductor light emitting device package of FIG. 5.
Figure 7A:
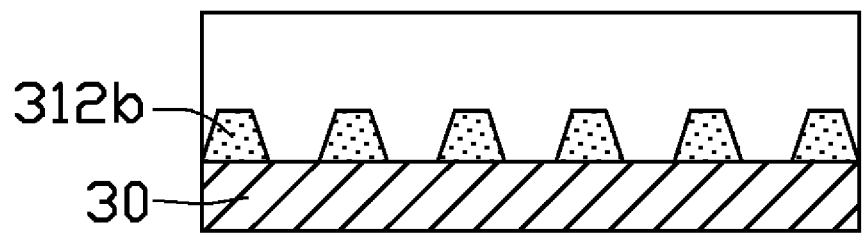
FIGS. 7A to 7F are cross sections of a plurality of second nanometer-reflective structures with modified structures.
Figure 7B:
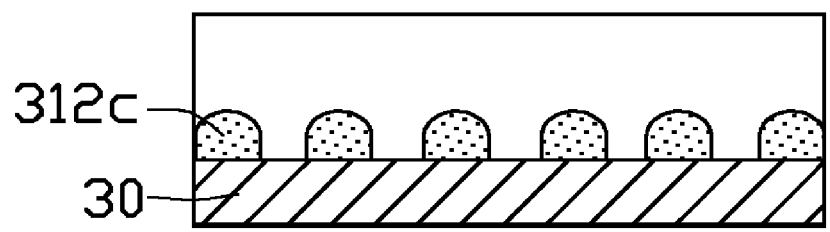
Figure 7C:
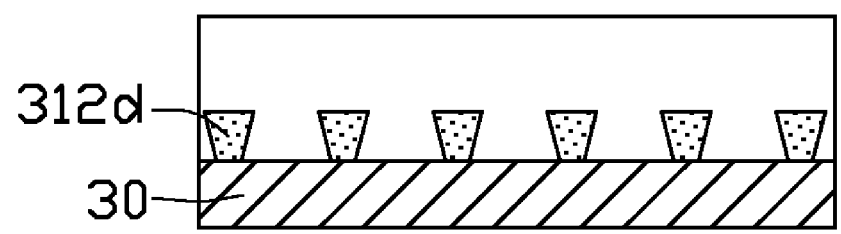
Figure 7D:
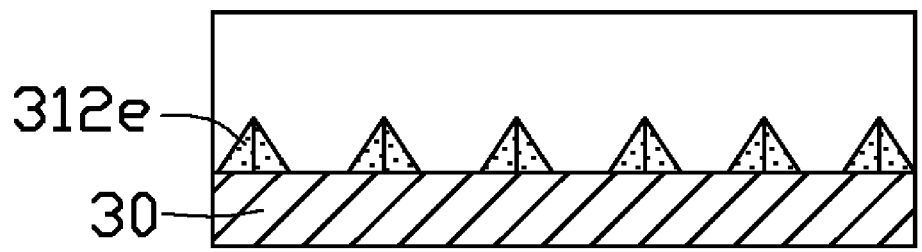
Figure 7E:
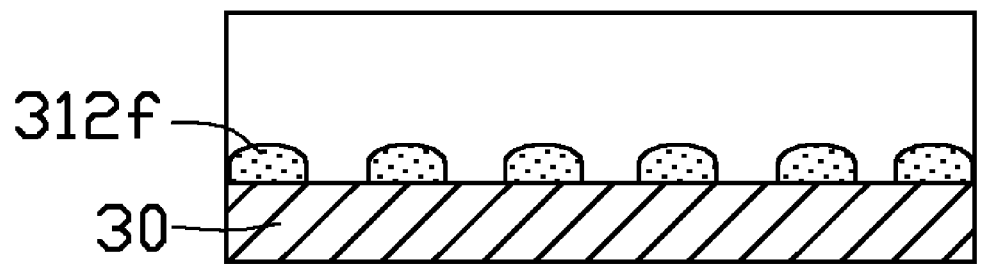
Figure 7F:
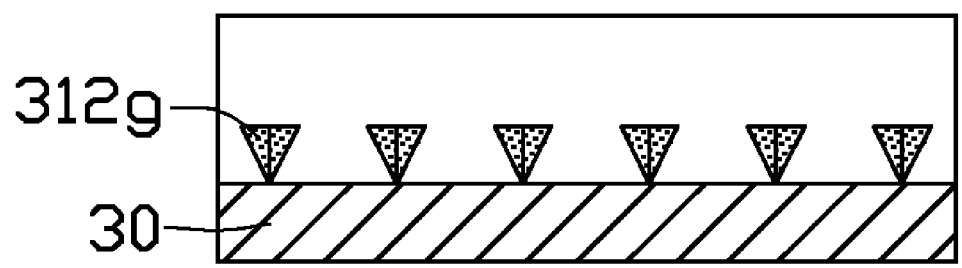

As shown in FIG. 5, the disclosure also provides a second embodiment of a semiconductor light emitting device package 2, differing from the first embodiment only in the presence of a second surface 32 located on the top surface of the lead frame 20. Referring to FIG. 6, the second surface 32 comprises a plurality of second reflective nanometer-structures 312 configured as a plurality of grooves, wherein the plurality of second reflective nanometer-structures 312 is aluminum or titanium formed by E-beam or etching. A plurality of protrusions 21 extend upwardly from the top surface of the lead frame 20. Each groove 22 is defined between two neighboring protrusions 21 and the corresponding second reflective nanometer-structures 312 formed thereon. Every pitch between each second reflective nanometer-structure 312 has a second interval $P_1$, shorter than half the wavelength of the visible light. Specifically, the second interval $P_1$ is about 90 to 130 nm. Moreover, each of the plurality of second reflective nanometer-structures 312 has a second depth $H_1$, wherein the ratio of the second depth $H_1$ over the second interval $P_1$ is not less than 2. Referring to FIG. 6, the cross section of each of the plurality of second reflective nanometer-structures 312 is rectangular. Alternatively, they may also be trapezoid, semi-circular, inverse-trapezoid, pyramided, elliptic, or inverse-pyramided or irregular, as shown in FIGS. 7A~7F. Moreover, while the top view of the second reflective nanometer-structures 312 shows multiple rectangles surrounding the semiconductor light emitting device 10 (not shown), the top view of the plurality of second reflective nanometer-structures 312 is not limited thereto and can have any structure sufficient to the same purpose. By the plurality of second reflective nanometer-structures 312 formed upon the lead frame 20, reflective efficiency of the lead frame 20 is enhanced.

According to the disclosure, the plurality of reflective nanometer-structures is formed on the reflective surface of the semiconductor light emitting device package and enhances light emitting efficiency and centralize light to a desired direction. Additionally, while the plurality of second reflective nanometer-structures is formed on the lead frame, the superficial surface and thermal-dissipative efficiency of the lead frame are increased simultaneously.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A semiconductor light emitting device package, comprising:
    a lead frame, comprising a carrier and a connection which are electrically disconnected from each other;
    a semiconductor light emitting device, disposed on the carrier and electrically connecting to the connection; and
    a reflector, surrounding the semiconductor light emitting device, comprising a reflective surface having a plurality of first reflective nanometer-structures;
    wherein a plurality of protrusions extend upwardly from a top surface of the lead frame, a second reflective nanometer-structure is formed on each protrusion, a groove is defined between each two neighboring protrusions and corresponding second reflective nanometer-structures formed thereon.

2. The semiconductor light emitting device package as claimed in claim 1, wherein every interval between each of the first and second reflective nanometer-structures is shorter than half the wavelength of the visible light.

3. The semiconductor light emitting device package as claimed in claim 2, wherein the every interval is between 90 and 130 nanometer.

4. The semiconductor light emitting device package as claimed in claim 2, wherein each of the first and second reflective nanometer-structures has a depth, and the ratio of the depth over the every interval is not less than 2.

5. The semiconductor light emitting device package as claimed in claim 1, wherein each of the first and second reflective nanometer-structures is trapezoid, inverted trapezoid, elliptical, semicircular, rectangular, pyramidical or inverted pyramidical.

6. The semiconductor light emitting device package as claimed in claim 1, wherein each of the first and second reflective nanometer-structures is aluminum or titanium.

7. The semiconductor light emitting device package as claimed in claim 1, wherein the reflector is plastic, ceramic, silicon or metal.

8. The semiconductor light emitting device package as claimed in claim 1, wherein the refractive index of the first nanometer-reflective structure exceeds the refractive index of the reflector.

9. The semiconductor light emitting device package as claimed in claim 1, wherein a cover layer encapsulates the semiconductor light emitting device and a portion of the lead frame.

10. The semiconductor light emitting device package as claimed in claim 9, wherein the cover layer comprises at least one wavelength converting element.

11. A semiconductor light emitting device package, comprising:
    a reflector, comprising a first reflective surface having a plurality of first reflective nanometer-structures;
    a lead frame, encapsulated within the reflector, comprising a second reflective surface having a plurality of second reflective nanometer-structures; and
    a semiconductor light emitting device, disposing and electrically connecting on/to the lead frame;
    wherein a plurality of protrusions extend upwardly from a top surface of the lead frame, each of the second reflective nanometer-structures is formed on a corresponding protrusion, the second reflective nanometer-structures together form the second reflective surface, and a groove is defined between each two neighboring protrusions and corresponding second reflective nanometer-structures formed thereon.

12. The semiconductor light emitting device package as claimed in claim 11, wherein the semiconductor light emitting device is surrounded by the first reflective surface.

13. The semiconductor light emitting device package as claimed in claim 11, wherein the lead frame comprises a carrier and a connection which are electrically disconnected from each other, and the semiconductor light emitting device is disposed on the carrier and electrically connecting to the connection.

14. The semiconductor light emitting device package as claimed in claim 11, wherein every interval between each of the first and second reflective nanometer-structures is shorter than half wavelength of the visible light.

15. The semiconductor light emitting device package as claimed in claim 14, wherein the every interval is between 90 and 130 nanometer.

16. The semiconductor light emitting device package as claimed in claim 14, wherein each of the first and second reflective nanometer-structures has a depth, and the ratio of the depth over the every interval is not less than 2.

17. The semiconductor light emitting device package as claimed in claim 11, wherein each of the first and second reflective nanometer-structures is trapezoid, inverted trapezoid, elliptical, semicircular, rectangular, pyramidical or inverted pyramidical.

18. The semiconductor light emitting device package as claimed in claim 11, wherein the refractive index of the first nanometer-reflective structure exceeds the refractive index of the reflector.

* * * * *

UNITED STATES PATENT AND TRADEMARK OFFICE
CERTIFICATE OF CORRECTION

PATENT NO.         : 8,324,648 B2
APPLICATION NO.    : 12/939180
DATED              : December 4, 2012
INVENTOR(S)        : Ko-Wei Chien Page 1 of 1

It is certified that error appears in the above-identified patent and that said Letters Patent is hereby corrected as shown below:

Title page, item (73) "Assignees" should reads as follows:

(73)  Assignee:  Advanced Optoelectronic Technology, Inc., Hsinchu Hsien (TW)

Signed and Sealed this
Twenty-ninth Day of October, 2013

Teresa Stanek Rea
*Deputy Director of the United States Patent and Trademark Office*